(12) United States Patent
Liao et al.

(10) Patent No.: US 7,473,103 B2
(45) Date of Patent: Jan. 6, 2009

(54) ELECTRICAL CONNECTOR WITH IMPROVED CONTACT

(75) Inventors: Chi-Nan Liao, Tu-Cheng (TW); Ke-Hao Chen, Tu-Cheng (TW); Fang-Jun Liao, Tu-Cheng (TW)

(73) Assignee: Hon Hai Precision Co., Ltd., Taipei Hsien (TW)

( * ) Notice: Subject to any disclaimer, the term of this patent is extended or adjusted under 35 U.S.C. 154(b) by 0 days.

(21) Appl. No.: 11/899,191

(22) Filed: Sep. 4, 2007

(65) Prior Publication Data
US 2008/0057749 A1     Mar. 6, 2008

(30) Foreign Application Priority Data
Sep. 1, 2006   (CN)   ................. 200620075897.5

(51) Int. Cl.
    *H01R 12/00*   (2006.01)
(52) U.S. Cl. ........................................ 439/66
(58) Field of Classification Search .............. 439/66, 439/70, 71, 81
See application file for complete search history.

(56) References Cited

U.S. PATENT DOCUMENTS
6,695,624 B1 *   2/2004   Szu ............................ 439/66

* cited by examiner

*Primary Examiner*—Javaid Nasri
(74) *Attorney, Agent, or Firm*—Wei Te Chung

(57) ABSTRACT

An electrical connector (100) for mounting on a board (3) includes an insulative housing (2) defining a number of passageways (20) and a number of contacts (1) received in corresponding passageways. Each contact includes a base portion (10), a tail portion (12) extending from one side of the base portion and electrically connecting to the board, a contact portion (16) projecting beyond an upper opening (21) of the passageway, and an intermediate portion (15) interconnecting the contact portion and the base portion in such a manner that the contact portion extends along a direction defining an angle with respect to both the base portion and the intermediate portion.

11 Claims, 7 Drawing Sheets

ELECTRICAL CONNECTOR WITH IMPROVED CONTACT

BACKGROUND OF THE INVENTION

1. Field of the Invention

The present invention generally relates to an electrical connector, and more particularly to an electrical connector connecting an IC module to a printed circuit board.

2. Description of Prior Art

A conventional Land Grid Array connector as shown in FIGS. 5-7 comprises a housing 3' and a plurality of contacts 9' received in corresponding cavities 50'. Each contact 9' includes a base portion 8', a solder tail 7', a resilient portion 6'. The resilient portion 6' has a horizontally extended portion 60' and a contacting end 62' projecting from the horizontally extended portion 60' and extending upwardly outside the cavity 50'. When an IC module 4' is mounted on the LGA connector, the contacting end 62' electrically connects to a conductive pad 20' of the IC module 4'. However, the contact region between the contacting end 62' and corresponding conductive pad 20' is not enough to maintain a reliable electrical connection therebetween limited to a configuration of the contact and the dimensions of the connector, which will thereby influence the performance of the IC module.

Therefore, an LGA connector having an improved contact structure is desired to overcome the shortcomings of the prior arts.

BRIEF SUMMARY OF THE INVENTION

Accordingly, it is an object of the present invention to provide an electrical connector having an improved contact which can ensure a reliable electrical connection to an IC module mounted thereto.

In order to achieve the objects set forth, an electrical connector for mounting on a board includes an insulative housing defining a number of passageways and a number of contacts received in corresponding passageways. Each contact includes a base portion, a tail portion extending from one side of the base portion and electrically connecting to the board, a contact portion projecting beyond an upper opening of the passageway, and an intermediate portion interconnecting the contact portion and the base portion in such a manner that the contact portion extends along a direction defining an angle with respect to both the base portion and the intermediate portion.

Other objects, advantages and novel features of the invention will become more apparent from the following detailed description of the present embodiment when taken in conjunction with the accompanying drawings.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE PREFERRED EMBODIMENT

Figure 1:
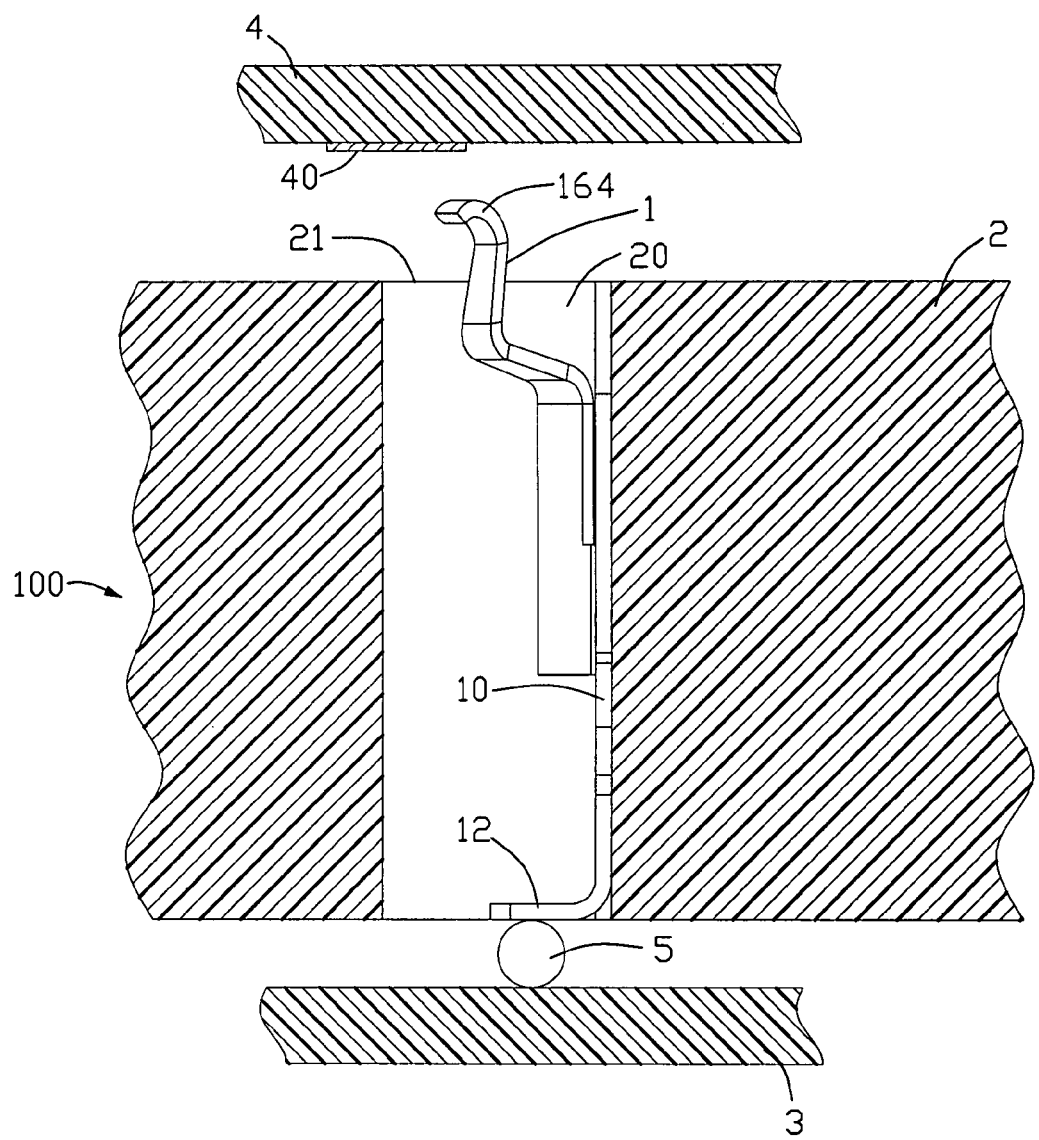
FIG. 1 is a cross-sectional view showing an LGA connector mounted on a mother board in accordance with the present invention and an IC module.

Reference will now be made to the drawing figures to describe the present invention in detail.

Figure 2:
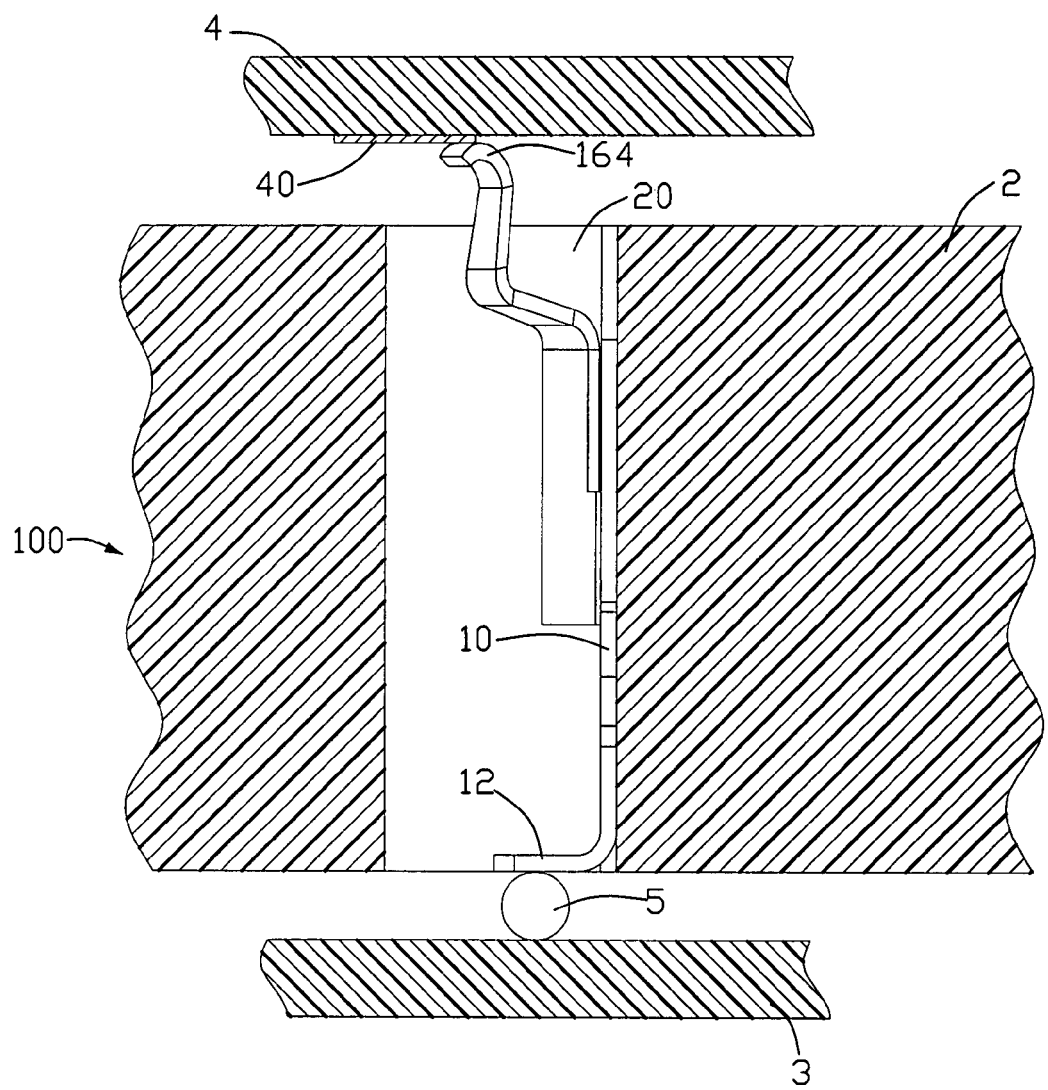
FIG. 2 is a view similar to FIG. 1 while the IC module is mounted on the LGA connector.

FIGS. 1-2 shows an electrical connector 100 in accordance with the embodiment of the present invention. In the preferred embodiment, the electrical connector 100 can be an LGA connector mounted on a mother board 3 which is used to connect with an IC module 4. The electrical connector 100 includes an insulative housing 2 defining a plurality of passageways 20 extending therethrough and a plurality of contacts 1 received in corresponding passageway 20. Each passageway 20 has an upper opening 21 opened to the outside.

Figure 3:
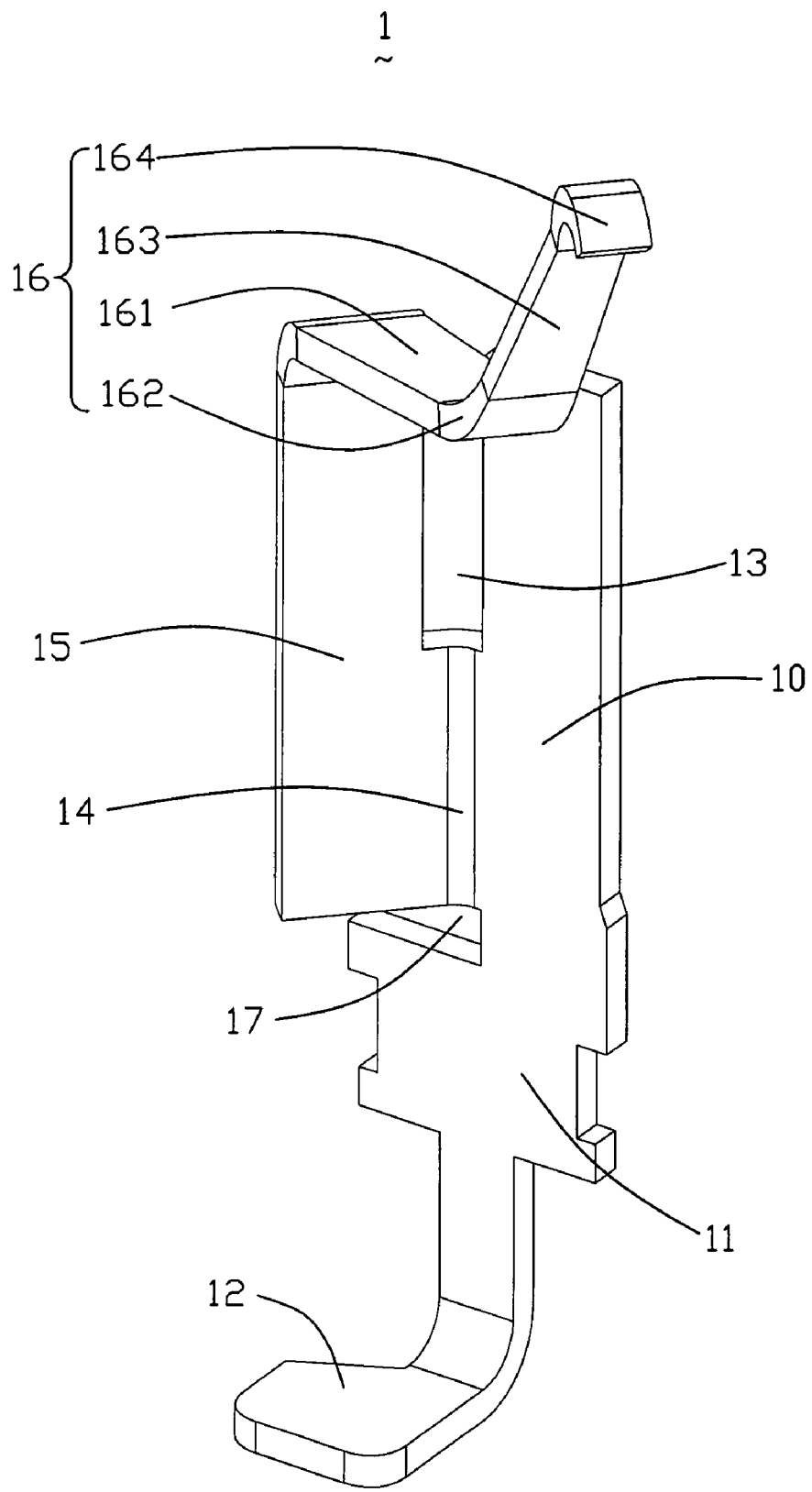
FIG. 3 is a perspective view of a contact of the LGA connector.

Turn to FIG. 3 with respect to FIGS. 1 and 2, each contact 1 comprises a base portion 10 extending within a corresponding passageway 20, a retaining portion 11 extending from a lower edge of the base portion 10, a tail portion for electrically connecting to the mother board 3, a contact portion 16 for electrically connecting to a corresponding conductive pad 40 of the IC module 4, and an intermediate portion 15 interconnecting the contact portion 16 and the base portion 10. The intermediate portion 15 extends in a plane different from that of the base portion 10 and is connected to the base portion 10 by a curved portion 14. In this preferred embodiment, the intermediate portion 15 together with the curved portion 14 forms a substantial "L"-shape. A first vertical slot 13 is defined between the intermediate portion 15 and the base portion 10, and a second horizontal slot 17 is defined between the intermediate portion 15 and an upper edge of the retaining portion 11. The two slots provide more resilience to the intermediate portion 15.

The contact portion 16 has a first portion 161 connected to an upper edge the intermediate portion 15, a second portion 162 bent from the first portion 161, a third portion 163 extending slantedly and forwardly from the second portion 162, and a curved free end 164 extends outwardly from the upper opening 21 for connecting to the conductive pad 40 of the IC module 4.

Figure 4:
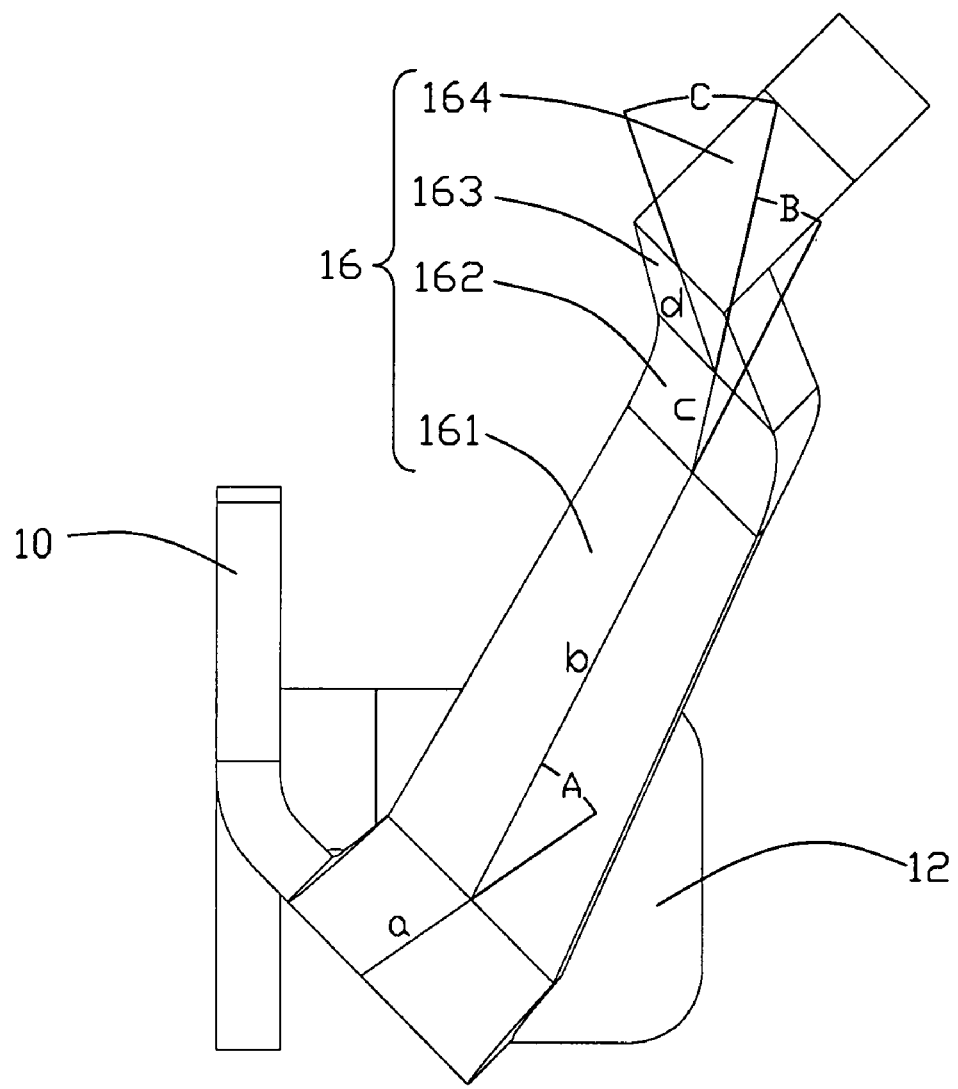
FIG. 4 is a top view of the contact shown in FIG. 3.
Figure 5:
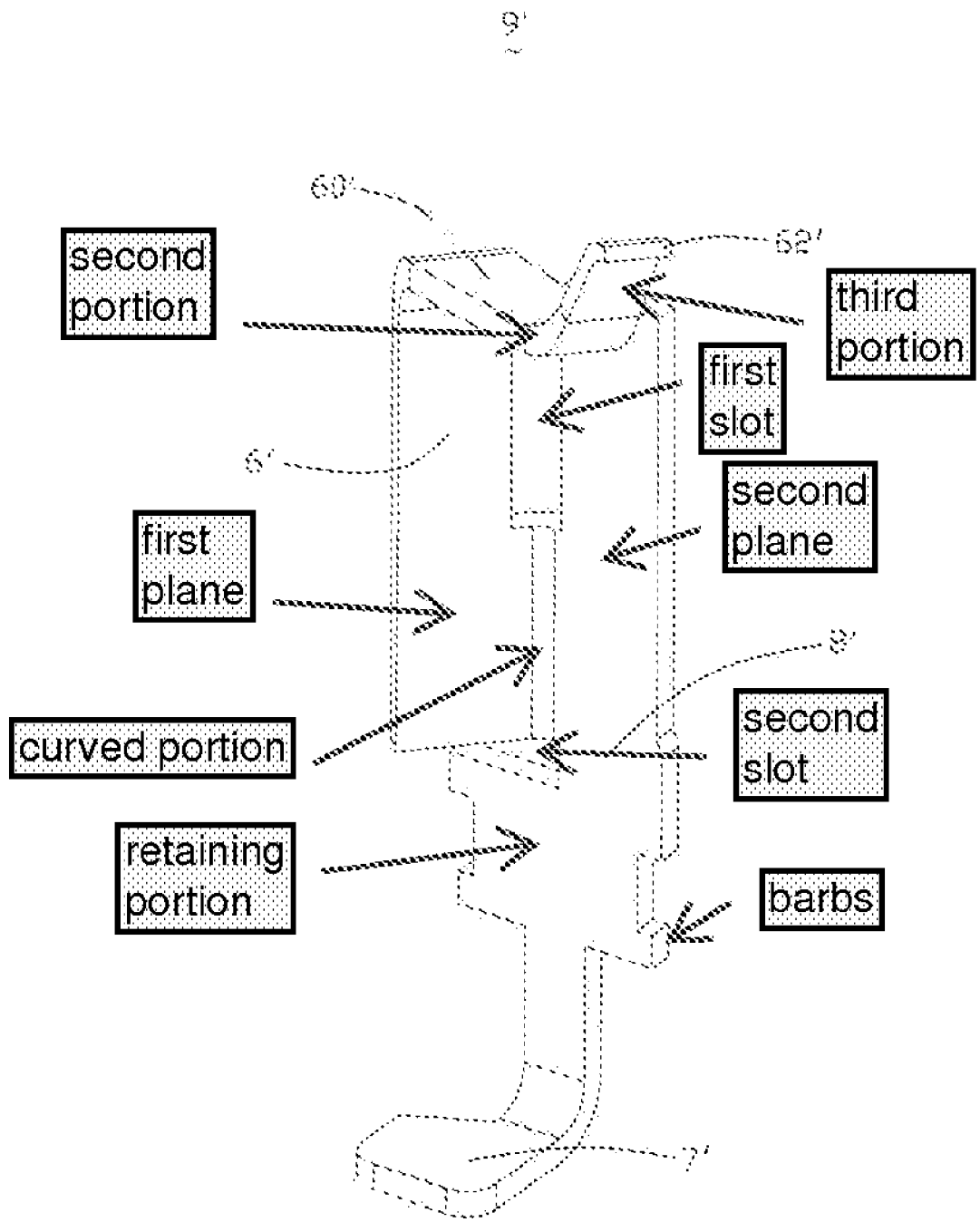
FIG. 5 is a perspective view of a conventional LGA contact.
Figure 6:
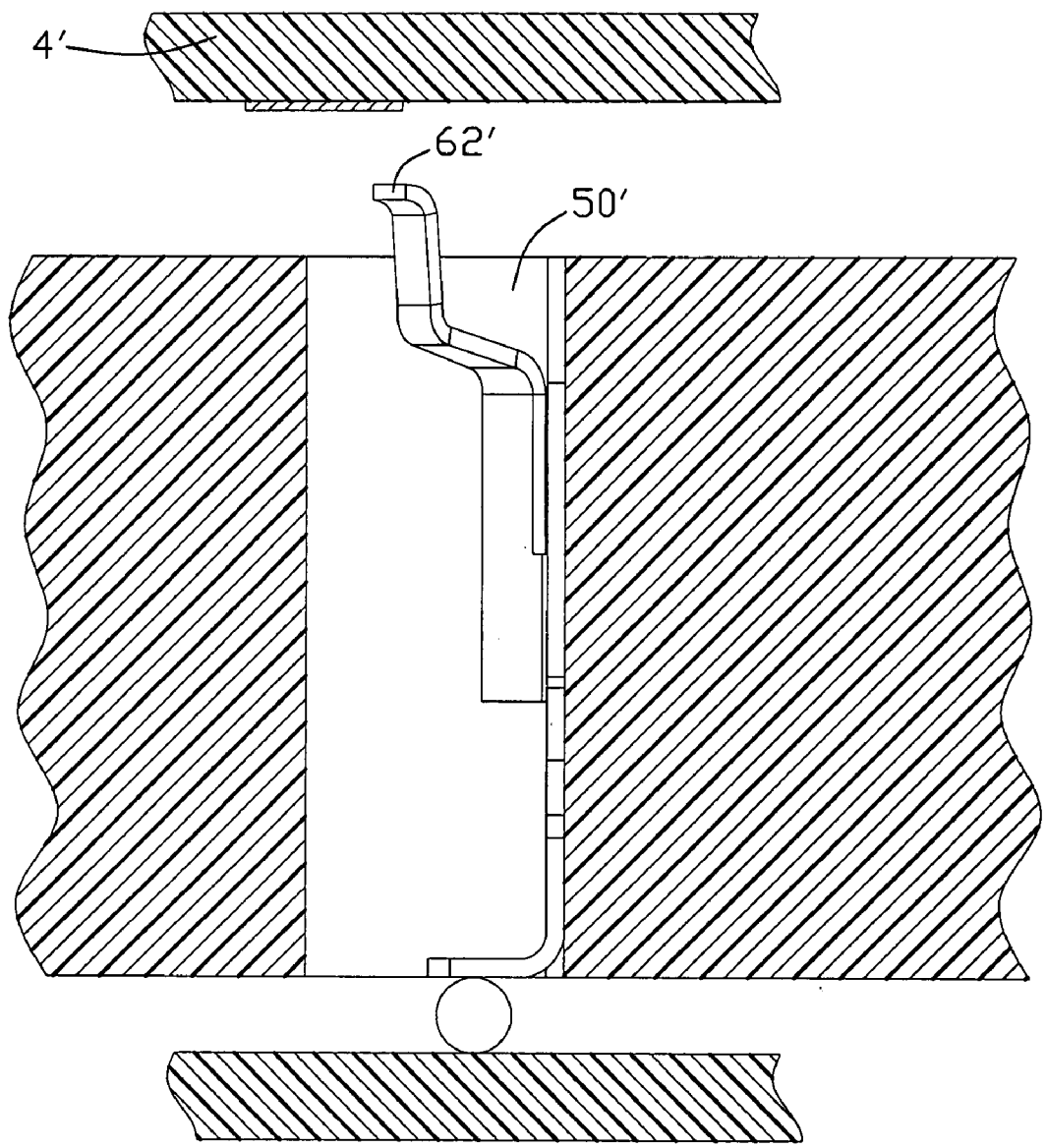
FIG. 6 is a cross-sectional view showing a conventional LGA connector mounted on a mother board and an IC module.
Figure 7:
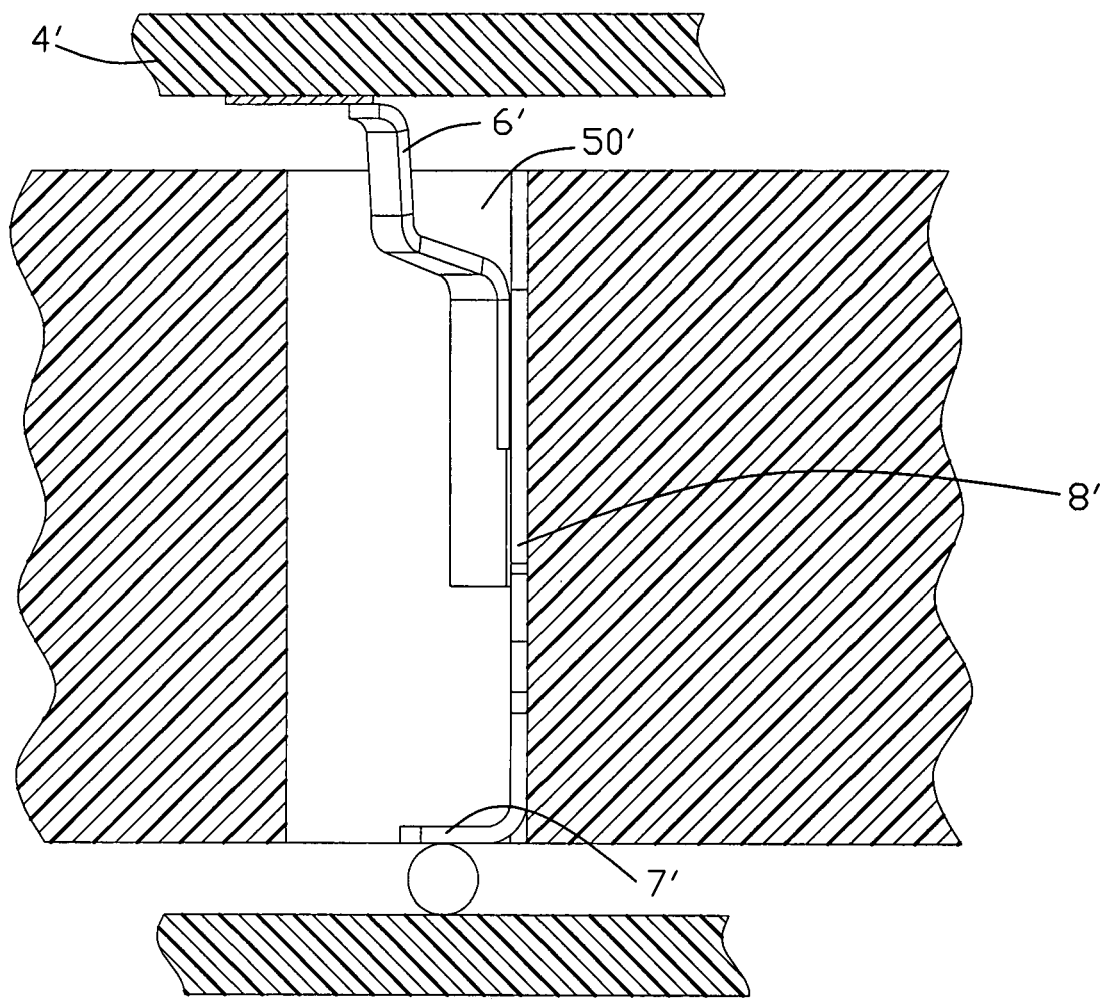
FIG. 7 is a view similar to FIG. 6 while the IC module is mounted on the conventional LGA connector.

Particularly referring to FIG. 4, a plane labeled "a" is a plane perpendicularly to the plane defined by the intermediate potion 15. An axis "b" of the first portion 161 of the contact portion 16 forms an angle "A" with respect to the plane "a". An axis "c" of the second portion 162 forms an angle "B", with respect to the first portion 161. Similarly, the slantedly extended, third portion 163 projecting from the second portion 162 along a direction "d" which forms an angle "C" with respect to the axis "c" of the second portion 162.

Together referring to FIGS. 1-4, the contact 1 is securely received in the passageway 20 with the base portion 10 abutting against inside wall of the passageway 20 and barbs (not labeled) on the retaining portion 11 interference-fitted therewith. The tail portion 12 is soldered onto the mother board 3 by a solder ball 5 pre-attached thereon. The contact free end 164 extends beyond a top face of the housing 2 and the IC module 4 is assembled on the connector 100 from a top side thereof. The contact free end 164 is compressibly connected to the conductive pad 40. Compared to the conventional design, the contact 1 of the present invention is placed on a position slanted towards the passageway such that obtaining a large contact region. Simultaneously, the rigidity of the contact is improved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general, meaning of the terms in which the appended claims are expressed.

We claim:

1. An electrical connector for mounting on a board, comprising:
    an insulative housing defining a plurality of passageways extending therethrough, said passageway having an upper opening;
    a plurality of contacts received in corresponding passageways, each contact comprising a base portion extending upwardly within the passageway, a tail portion extending from one side of the base portion and electrically connecting to the board, a contact portion projecting beyond the upper opening, and an intermediate portion interconnecting the contact portion and the base portion in such a manner that said contact portion extends along a direction defining an angle with respect to said base portion and said intermediate portion, said contact portion including a first portion connecting to said intermediate portion, a second and a third portions, and a free end connecting to said third portion;
    wherein the second portion is tilted toward the base portion more than the first portion is tilted toward the base portion, and the third portion is tilted toward the base portion more than the second portion is tilted toward the base portion in a top view.

2. The electrical connector as claimed in claim 1, wherein said intermediate portion comprises a curved portion connecting to said base portion, and wherein said intermediate portion extends along a first plane and said base portion extends along a second plane which forms an angle with the first plane.

3. The electrical connector as claimed in claim 2, wherein said contact portion comprises a slantedly extended portion connecting to said intermediate portion and a distal free end formed thereon.

4. The electrical connector as claimed in claim 1, wherein said contact further comprises a retaining portion formed at one end of the base portion and connecting to the tail portion, and wherein said retaining portion has a plurality of barbs formed thereon for securing the contact in said passageway.

5. The electrical connector as claimed in claim 1, wherein the contact defines a first slot between said intermediate portion and said base portion, and a second slot between said intermediate portion and said retaining portion, and wherein said first slot extends along a direction perpendicular to said second slot.

6. An electrical connector comprising:
    an insulative housing defining at least one passageway therein;
    a contact disposed in the passageway, said contact including:
    a retention base section;
    a tail section located below the retention section; and
    a contact section positioned beside the retention section and including:
    a first segment extending along a first direction in a top view;
    a second segment extending from the first segment along a second direction angled with the first direction in the top view; and
    a third segment extending from the second segment opposite to the first segment along a third direction angled with both said first direction and said second direction in the top view; wherein
    a first acute angle is formed between the first direction and the second direction, a second acute angle is formed between the second direction and the third direction, and a third acute angle is formed between the first direction and the third direction under a condition that the third angle is equal to a sum of the first angle and the second angle;
    wherein the second direction is tilted toward the retention base section more than the first direction is tilted toward the base portion, and the third direction is tilted toward the retention base section more than the second direction is tilted toward the base portion in the top view.

7. The electrical connector as claimed in claim 6, wherein the first segment essentially extends in a plane while the second segment extends curvedly.

8. The electrical connector as claimed in claim 6, wherein the third segment essentially extends in a plane while the second segment extends curvedly.

9. The electrical connector as claimed in claim 6, wherein in the top view a fourth segment extends from the third segment for contacting an electronic package, and extending in a fourth direction closer to a fifth direction along which a curved portion of an intermediate portion extends, under a condition that first segment extends from the curved portion.

10. The electrical connector as claimed in claim 9, wherein the second segment defines an upward curve while the curved portion defines a downward curve.

11. The electrical connector as claimed in claim 6, wherein the first segment essentially extends in a first plane, the second segment essentially extends curvedly, and the third segment essentially extends in a second plane under a condition that the second plane is steeper than the first plane.

* * * * *